US007301213B2

(12) United States Patent
Matsubara et al.

(10) Patent No.: US 7,301,213 B2
(45) Date of Patent: Nov. 27, 2007

(54) ACOUSTIC SENSOR

(75) Inventors: Naoteru Matsubara, Gifu (JP); Michinori Okuda, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 192 days.

(21) Appl. No.: 11/188,800

(22) Filed: Jul. 26, 2005

(65) Prior Publication Data

US 2006/0022285 A1 Feb. 2, 2006

(30) Foreign Application Priority Data

Jul. 30, 2004 (JP) ............................ 2004-223117
Jan. 21, 2005 (JP) ............................ 2005-014302

(51) Int. Cl.
*H01L 29/84* (2006.01)

(52) U.S. Cl. .............. 257/416; 257/595; 257/E31.113; 257/E31.124; 381/175; 381/423

(58) Field of Classification Search ................ 257/416
See application file for complete search history.

(56) References Cited

U.S. PATENT DOCUMENTS 6,441,451 B1 * 8/2002 Ikeda et al. ................ 257/418
2003/0063762 A1 * 4/2003 Tajima et al. .............. 381/111

FOREIGN PATENT DOCUMENTS

| | | |
|---|---|---|
| JP | 60-500841 | 5/1985 |
| JP | 2002-27595 | 1/2002 |
| WO | WO 84/03410 | 8/1984 |

OTHER PUBLICATIONS

Korean Office Action dated Sep. 27, 2006, with English translation.

* cited by examiner

*Primary Examiner*—Tu-Tu Ho
(74) *Attorney, Agent, or Firm*—McDermott Will & Emery LLP

(57) ABSTRACT

A sound hole is provided in a silicon substrate. A diaphragm electrode is secured to the upper surface of the silicon substrate via at least one fixed end so as to cover the sound hole of the silicon substrate. The diaphragm electrode is provided with four projections extending in respective directions of diameter orthogonal to each other. The fixed end is provided in one of the four projections. Hinge shafts are provided in the other three projections. A backplate electrode is provided above the diaphragm electrode so as to form a capacitor.

16 Claims, 12 Drawing Sheets

ACOUSTIC SENSOR

BACKGROUND OF THE INVENTION

1. Field of the Invention

The present invention relates to an acoustic sensor and, more particularly, to an acoustic sensor formed on a semiconductor substrate.

2. Description of the Related Art

A capacitive silicon microphone is proposed as a semiconductor sensor for detecting acoustic vibration. In a microphone of this type, a diaphragm electrode and a backplate electrode are provided on a semiconductor substrate so as to form a capacitor. When sound pressure is applied to the microphone, the diaphragm electrode is vibrated. As the distance between the diaphragm electrode and the backplate electrode varying, the capacitance of the capacitor varies accordingly. Variation in voltage caused by the variation in capacitance is measured. The measured voltage represents an audio signal received by the microphone (See Reference (1) in the following Related Art List, for instance).

Related Art List (1) Published Japanese translation of PCT International publication No. 60-500841.

A capacitive silicon microphone may be of smaller size and lighter weight than an elecret condenser microphone. The inventor of the present invention has come be aware of the following problem. The structural mechanical strength of a capacitive silicon microphone is likely to be impaired low due to its size smaller than that of the elecret condenser microphone. Further, a temperature cycle of a range between 400° and 800° is gone through every time a silicon nitride film or a silicon oxide film is deposited in the fabrication process. Therefore, a difference in stress is developed between the semiconductor substrate (a silicon substrate) and the diaphragm electrode. This results in internal stress and bending moment being developed in the diaphragm electrode, thereby reducing the sensitivity of the diaphragm. Reduction in sensitivity is also incurred due to capacitance around the diaphragm electrode and the backplate electrode. More specifically, the sensitivity corresponds to a value obtained by dividing the variation in capacitance caused by sound pressure by the overall capacitance. Ambient capacitance primarily acts to increase the overall capacitance and so practically leads to reduction in sensitivity.

SUMMARY OF THE INVENTION

The present invention has been made in view of the aforementioned circumstances and its object is to provide an acoustic sensor capable of detecting an audio signal with improved sensitivity while maintaining required physical strength.

In order to solve the aforementioned problem, the present invention according to one aspect provides a movable electrode which is secured to a first surface of a semiconductor substrate via at least one fixed end so as to cover a sound hole provided in the semiconductor substrate; a fixed electrode provided to form a capacitor in combination with the movable electrode; and an output unit which, when the movable electrode is vibrated due to sound pressure entering from a second surface of the semiconductor substrate via the sound hole, outputs variation in the capacitance of the capacitor due to the vibration as an audio signal. A hinge shaft is formed in a part of the movable electrode other than the at least one fixed end, and the movable electrode is engaged with the semiconductor substrate by a hinge structure based on the hinge shaft.

The terms "first surface" and "second surface" refer to two surfaces of the semiconductor substrate for convenience. These may refer to "left" and "right" surfaces as well as "upper" and "lower" surfaces.

The requirement with the "fixed electrode" is that it forms a capacitor by facing the movable electrode. The relation with respect to the first surface in terms of its position is non-limiting. Preferably, the fixed electrode is provided farther away from the first surface than the movable electrode.

The term "hinge structure" generally refers to a structure in which an object including a hinge shaft opens or closes in association with the rotational motion of the hinge shaft. In this case, any structure meets the definition as long as it restricts the free movement of the hinge shaft. The object may not open or close as a result of the parts of the object other than the hinge shaft being fixed. In other words, the term refers to the restriction of vertical and horizontal movement of the movable electrode including the hinge shaft beyond a certain extent.

According to this aspect, the movable electrode is only secured to the semiconductor substrate via at least one fixed end. Therefore, it is ensured that the movable electrode is only slightly affected by a difference in stress between the movable electrode and the semiconductor substrate. Since the vibration of the movable electrode is restricted by the hinge structure, the structural strength is prevented from being reduced even if the movable electrode is only secured via the at least one fixed end.

The hinge shaft and the at least one fixed end of the movable electrode may be provided outside an area above the first surface of the semiconductor substrate occupied by the fixed electrode. The above-described structure helps decrease the overall capacitance while maintaining the amount of variation in capacitance unchanged. Accordingly, sensitivity is practically increased.

The movable electrode may be formed as projections outside an area occupied by the fixed electrode. Since the hinge shaft and the at least one fixed end are formed as projections, the area of air gap formed by the movable electrode and the fixed electrode is reduced even when the hinge shaft and the at least one fixed end are removed from an area occupied by the fixed electrode. Accordingly, the structural strength is improved.

The movable electrode may be provided with a protrusion at a portion facing the first surface of the semiconductor substrate. The protrusion prevents the movable electrode from being attached to the semiconductor substrate.

The present invention according to another aspect also provides an acoustic sensor. The acoustic sensor according to this aspect comprises: a movable electrode which is secured to a first surface of a semiconductor substrate via at least one fixed end so as to cover a sound hole provided in the semiconductor substrate; a fixed electrode provided to form a capacitor in combination with the movable electrode; and an output unit which, when the movable electrode is vibrated due to sound pressure entering from a second surface of the semiconductor substrate via the sound hole, outputs variation in the capacitance of the capacitor due to the vibration as an audio signal. A hook part is provided in a part of the movable electrode other than the at least one fixed end, and the movable electrode is engaged with the semiconductor substrate via the hook part.

The term "hook part" refers to a bent part at an end. The way the end is bent may be optional. What is essential is that it has a configuration engageable with the semiconductor substrate. For example, the end may be bent in a predetermined direction to form an L shape or may be bent both ways to form a T shape. Alternatively, the end may be of a circular configuration.

According to this aspect, the movable electrode is only secured to the semiconductor substrate via at least one fixed end. Therefore, it is ensured that the movable electrode is only slightly affected by a difference in stress between the movable electrode and the semiconductor substrate. Since the vibration of the movable electrode is restricted by the engagement at the hook part, the structural strength is prevented from being reduced even if the movable electrode is only secured via the at least one fixed end. Since the movable electrode and the semiconductor substrate are only engaged with each other by the hook part except at the fixed end, the structure is simplified.

The hook part of the movable electrode may be engaged with a socket for the hook part provided in the semiconductor substrate. In this case, the socket for the hook part provided in the semiconductor substrate engages therewith the hook part provided in the movable electrode.

The present invention according to still another aspect also provides an acoustic sensor. The acoustic sensor according to this aspect comprises: a movable electrode which is secured to a first surface of a semiconductor substrate via at least one fixed end so as to cover a sound hole provided in the semiconductor substrate; a fixed electrode provided to form a capacitor in combination with the movable electrode; and an output unit which, when the movable electrode is vibrated due to sound pressure entering from a second surface of the semiconductor substrate via the sound hole, outputs variation in the capacitance of the capacitor due to the vibration as an audio signal. A projection with a ring-shaped end is provided in a part of the movable electrode other than the at least one fixed end, and the movable electrode is engaged with the semiconductor substrate via the projection with a ring-shaped end.

Although the term "ring-shaped" generally refers to an annular configuration, the configuration may not be circular but rectangular. The ring-shaped end may not be of a continuous structure such as that of an annulus ring but a structure in which a portion thereof is cut out. That is, the essential requirement is that the ring-shaped end hooks into the substrate so as to be engaged therewith.

According to this aspect, the movable electrode is only secured to the semiconductor substrate via at least one fixed end. Therefore, it is ensured that the movable electrode is only slightly affected by a difference in stress between the movable electrode and the semiconductor substrate. Since the vibration of the movable electrode is restricted by the engagement at the ring-shaped end, the structural strength is prevented from being reduced even if the movable electrode is only secured via the at least one fixed end.

The movable electrode may be engaged with the semiconductor substrate by the ring-shaped end of the projection of the movable electrode being run through by a shaft provided in the semiconductor substrate. In this case, the shaft provided in the semiconductor substrate engages therewith the ring-shaped end provided in the movable electrode.

The present invention according to yet another aspect also provides an acoustic sensor. The acoustic sensor according to this aspect comprises: a movable electrode which is secured to a first surface of a semiconductor substrate via at least one fixed end so as to cover a sound hole provided in the semiconductor substrate; a fixed electrode provided to form a capacitor in combination with the movable electrode; and an output unit which, when the movable electrode. is vibrated due to sound pressure entering from a second surface of the semiconductor substrate via the sound hole, outputs variation in the capacitance of the capacitor due to the vibration as an audio signal. The movable electrode is engaged with the semiconductor substrate via a part other than the at least one fixed end.

According to this aspect, the movable electrode is only secured to the semiconductor substrate via at least one fixed end. Therefore, it is ensured that the movable electrode is only slightly affected by a difference in stress between the movable electrode and the semiconductor substrate. Since the vibration of the movable electrode is restricted by a predetermined engagement point, the structural strength is prevented from being reduced even if the movable electrode is only secured via the at least one fixed end.

According to the present invention, there is provided an acoustic sensor capable of detecting an audio signal with improved sensitivity while maintaining required physical strength.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

FIRST EXAMPLE

An overview of the present invention will be given before describing it specifically. The first example of the present invention relates to a capacitive silicon microphone formed on a semiconductor substrate. A capacitive silicon microphone is fabricated such that a diaphragm electrode is provided on a first surface of a semiconductor substrate so as to cover a sound hole formed on the semiconductor substrate. A backplate electrode is provided farther away from the first surface than the diaphragm electrode. In the capacitive silicon microphone according to the example, the diaphragm electrode is secured to the semiconductor substrate via a single fixed end.

Further, a plurality of hinge shafts are formed at respective edges of the diaphragm electrode. The hinge structure based on the plurality of hinge shafts secures the diaphragm electrode to the semiconductor substrate by engagement. Since the diaphragm electrode is directly secured to the semiconductor substrate only via a single fixed end, the electrode is only slightly affected by a difference in stress between the electrode and the semiconductor substrate. Since the parts other than the fixed end are engaged with the semiconductor substrate by the hinge structure, the motion range of the diaphragm electrode is limited. Therefore, the structural strength is prevented from being reduced even if there is only one fixed end.

Viewed from the first surface of the semiconductor substrate, the fixed end and the hinge shafts of the diaphragm electrode are provided outside an area occupied by the backplate electrode. This ensures that the portion of the diaphragm electrode corresponding to the backplate electrode is vibrated relatively strongly in response to sound pressure. As a result, sensitivity is improved. Further, the diaphragm has a configuration in which the fixed end and the hinge shafts are formed as projections, ensuring that the fixed end and the hinge shafts are provided at positions removed from the area occupied by the backplate electrode. In this way, sensitivity is improved. In comparison with a structure in which the diaphragm electrode is of a circular configuration and has its fixed end removed from an area occupied by the backplate electrode, the area of the diaphragm is reduced so that the structural intensity is improved.

Figure 1:
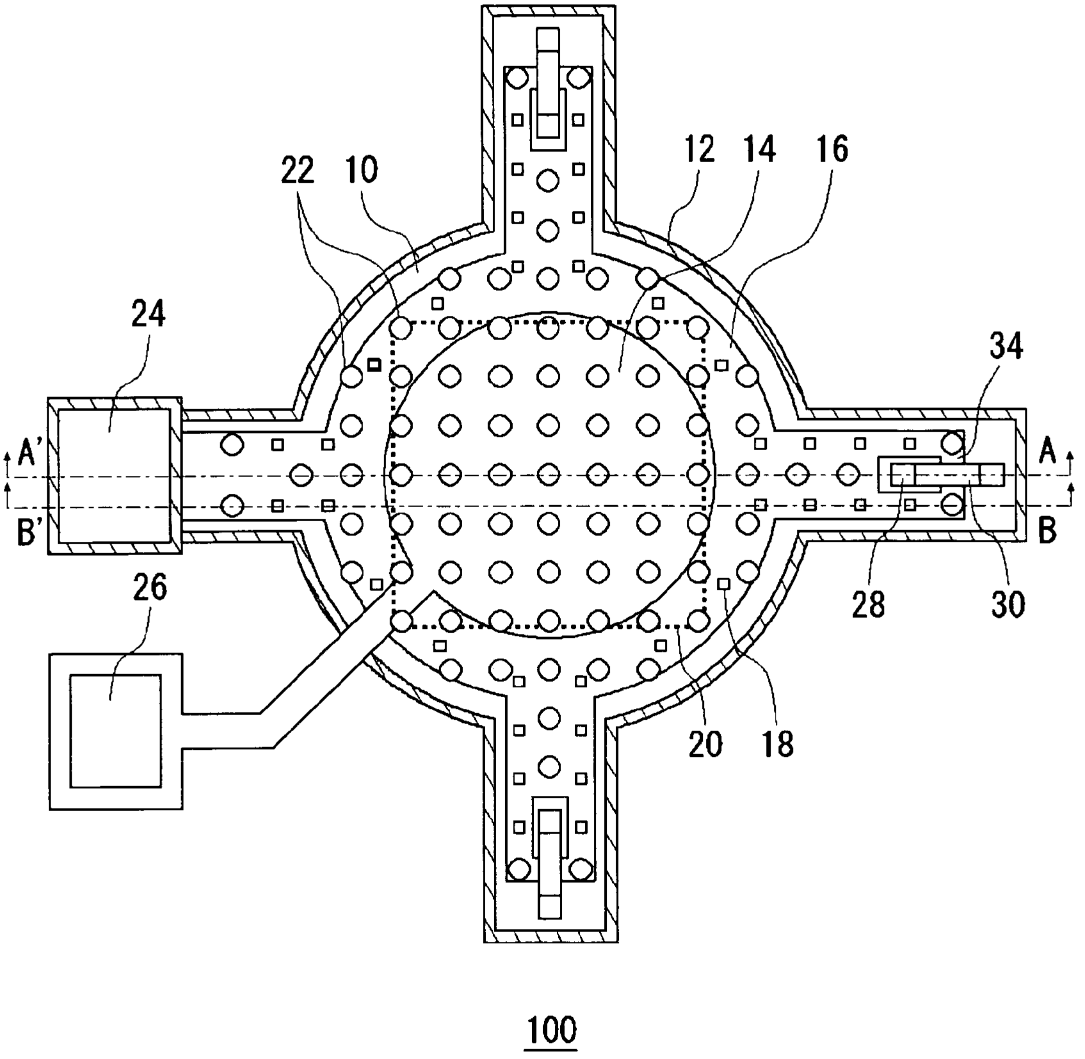
FIG. 1 is a top view illustrating the structure of an acoustic sensor according to a first example of the present invention.
Figure 2:
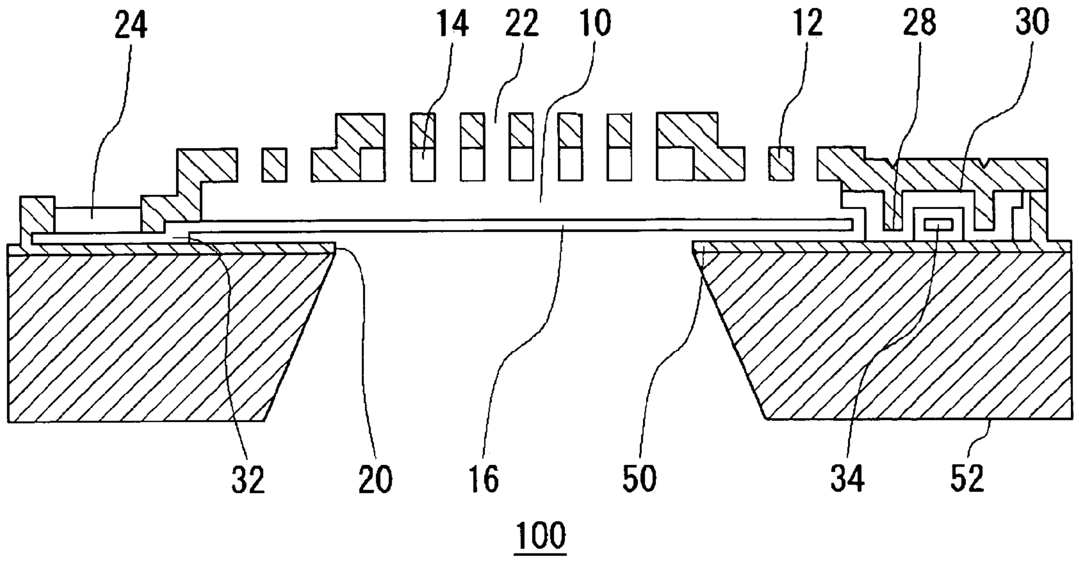
FIG. 2 is a first section of the acoustic sensor of FIG. 1.
Figure 3:
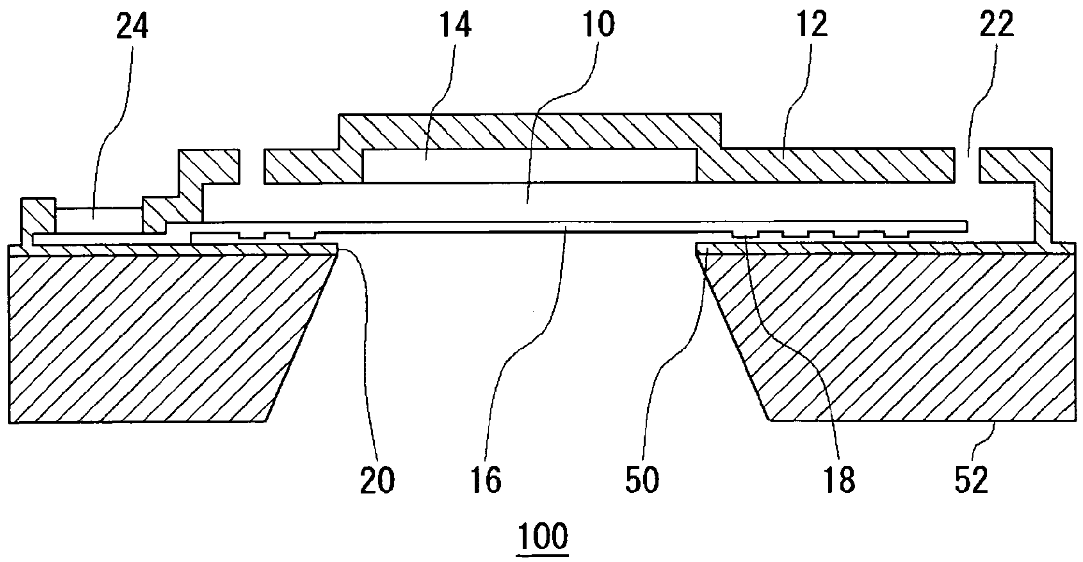
FIG. 3 is a second section of the acoustic sensor of FIG. 1.

FIG. 1 is a top view illustrating the structure of an acoustic sensor 100 according to the first example of the present invention. FIG. 2 is a first section of the acoustic sensor 100; and FIG. 3 is a second section of the acoustic sensor 100. FIG. 2 is a A-A' section of the acoustic sensor 100 of FIG. 1; and FIG. 3 is a B-B' section of the acoustic sensor 100 of FIG. 1. The following description of the acoustic sensor 100 will refer to these drawings.

The acoustic sensor 100 includes an air gap layer 10, a protective film 12, a backplate electrode 14, a diaphragm electrode 16, a diaphragm protrusion 18, a substrate opening 20, an acoustic hole 22, a pad electrode 24 for the diaphragm, a pad electrode 26 for the backplate, a hinge anchor 28, a bridge 30, an etch stopper 50 and a silicon substrate 52. As is obvious from FIG. 2 and FIG. 3, the air gap layer 10 cannot be directly seen in a top view of FIG. 1. FIG. 1 is modified appropriately to expose unviewable portions for ease of understanding of the structure. While the first surface and the second surface will be referred to as the top surface and the bottom surface, respectively, the first and second surfaces may be other locations.

The silicon substrate 52 serves as a base for the acoustic sensor 100. As illustrated in FIG. 2 and FIG. 3, a sound hole is provided to extend from top to bottom of the silicon substrate 52. As illustrated in FIG. 1, the substrate opening 20 defining the sound hole has a rectangular configuration. The upper surface of the silicon substrate 52 is provided with the etch stopper 50.

As illustrated in FIG. 2, the diaphragm electrode 15 is secured to the upper surface of the silicon substrate 52 via at least one fixed end 32 so as to cover the sound hole of the silicon substrate 52 in the cross section. In the illustrated example, the fixed end 32 is provided toward the end of the illustrated structure in which the pad electrode 24 for the diaphragm is provided. More specifically, the diaphragm 16 is secured to silicon substrate 52 and the etch stopper 50 via the single fixed end 32. Sound pressure is input from the bottom of the sound hole of FIG. 2 and FIG. 3. The diaphragm electrode is formed to be vibrated, or movable, by the sound pressure.

Referring to FIG. 1, the diaphragm electrode 16 has four projections extending in respective directions of diameter that are orthogonal to each other. The fixed end 32 is provided in one of the four projections. The hinge shafts 34 are formed in the other three projections. As is obvious from FIG. 2, the hinge shaft 34, the hinge anchor 28 and the bridge 30 form the hinge structure. The diaphragm electrode 16 is engaged with the etch stopper 50 by the hinge structure 50. The hinge structure is formed such that the hinge shaft 34 is surrounded by the hinge anchor 28 and the bridge 30. More specifically, referring to FIG. 2, the hinge anchor 28 restricts the lateral movement of the hinge shaft 34 and the bridge 30 supported by the hinge anchor 28 restricts the upward movement of the hinge shaft 34. As a result of the movement of the hinge shaft 34 being restricted as described above, the movement of the diaphragm electrode 16 is restricted accordingly.

As illustrated in FIG. 1, the hinge shaft 34 and the fixed end 32 of the diaphragm electrode 16 are provided above the upper surface of the silicon substrate 52 outside an area occupied by the backplate electrode 14. As mentioned above, the hinge shaft 34 and the fixed end 32 of the diaphragm electrode 16 are configured as projections outside the area occupied by the backplate electrode 14. Assuming that the hinge shaft 34 and the fixed end 32 are not projections but are still provided at the respective positions illustrated in FIG. 1, the diaphragm electrode 16 will end up having a configuration of a circle with a diameter being defined by a distance between the pad electrode 24 for the diaphragm and the hinge shaft 34. This will increase the area of the air gap layer 10 and the diaphragm electrode 16, reducing strength accordingly. As illustrated in FIG. 3, the diaphragm protrusions 18 are provided in the diaphragm electrode 16 at portions facing the upper surface of the silicon substrate 52.

As illustrated in FIG. 2 and FIG. 3, the backplate electrode 14 is provided above the diaphragm electrode 16 so as to form a capacitor in combination with the backplate electrode 14. As the diaphragm electrode 16 is vibrated due to sound pressure, the capacitance of the capacitor varies. Further, as illustrated in FIG. 1, the backplate electrode 14 is designed to be of a size occupying at least a portion of the substrate opening 20 or the sound hole.

As illustrated in FIG. 2 and FIG. 3, the protective film 12 is formed to cover the backplate electrode 14 and the diaphragm electrode 16. A space created between an assembly of the protective film 12 and the backplate electrode 14 and the diaphragm electrode 16 will be referred to as the air gap layer 10. The protective film 12 and the backplate electrode 14 are provided with a plurality of acoustic holes 22.

The pad electrode 24 for the diaphragm and the pad electrode 26 for the backplate are connected to the diaphragm electrode 16 and the backplate electrode 14, respectively, so as to apply a predetermined voltage to the respective electrodes. As the capacitance of the capacitor formed by the diaphragm electrode 16 and the backplate electrode 14 varies, the potential difference between the pad electrode 24 for the diaphragm and the pad electrode 26 for the backplate varies accordingly. The potential difference thus varying is output as an audio signal. In other words, the pad electrode 24 for the diaphragm and the pad electrode 26 for the backplate detect variation in the capacitance of the capacitor indirectly. The output audio signal is processed by a processing unit (not shown). The process includes, for example, outputting via a speaker and storage of the audio signal after conversion into a digital signal.

Figure 4A:
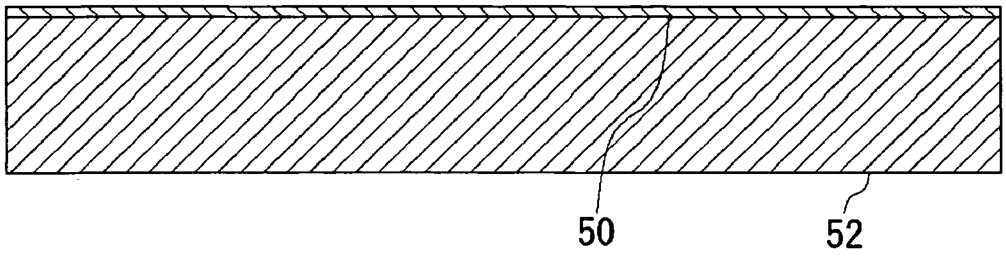
FIGS. 4A-4C illustrate the steps of fabricating the acoustic sensor of FIG. 1.
Figure 4B:
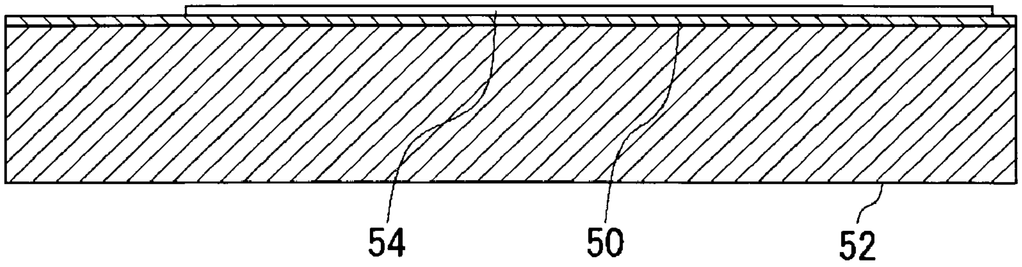
Figure 4C:
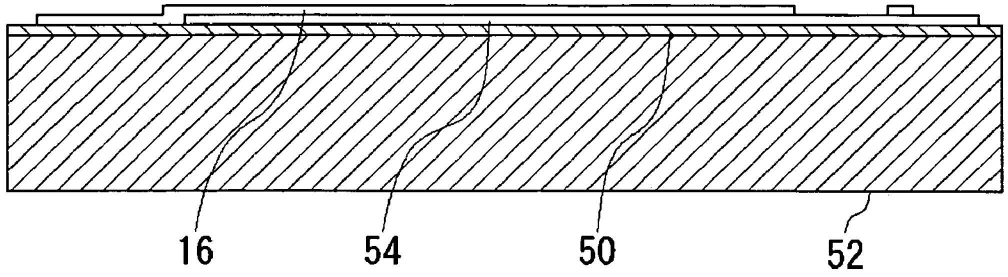

FIGS. 4A-4C illustrate the steps of fabricating the acoustic sensor 100. Like FIG. 2, FIGS. 4A-4C represent A-A' sections of the acoustic sensor 100 of FIG. 1.

In step 1 of FIG. 4A, the etch stopper 50 is deposited on the silicon substrate 52. A silicon nitride film is generally used as the etch stopper 50. The gas used to form a silicon nitride film may be a mixture of monosilane and ammonia or a mixture of dichlorosilane and ammonia. The deposition temperature is 300° C.-600° C.

In step 2 of FIG. 4B, a first sacrificial film 54 is deposited on the etch stopper 50. A silicon oxide film containing phosphorous (P) is generally used as the first sacrificial film 54. Alternatively, any type of film may be used as long as the film is soluble in hydrofluoric acid (HF). The first sacrificial film 54 is removed later in the process by etching by HF and does not remain in the ultimate structure. Areas at the periphery of the first sacrificial film 54 are removed using the ordinary photolithography technology and the etching technology. Further, in order to form the diaphragm protrusions 18 in the diaphragm electrode 16 (not shown) later in the process, associated portions of the first sacrificial film 54 are partially etched. This etching is stopped in the middle of process before reaching the etch stopper 50.

In step 3 of FIG. 4C, the diaphragm electrode 16 is deposited on the first sacrificial film 54. Polysilicon is generally used as the diaphragm electrode 16. Other conductive materials may be used alternatively. Unnecessary portions of the diaphragm electrode 16 are removed using the ordinary photolithography technology and the etching technology.

Figure 5A:
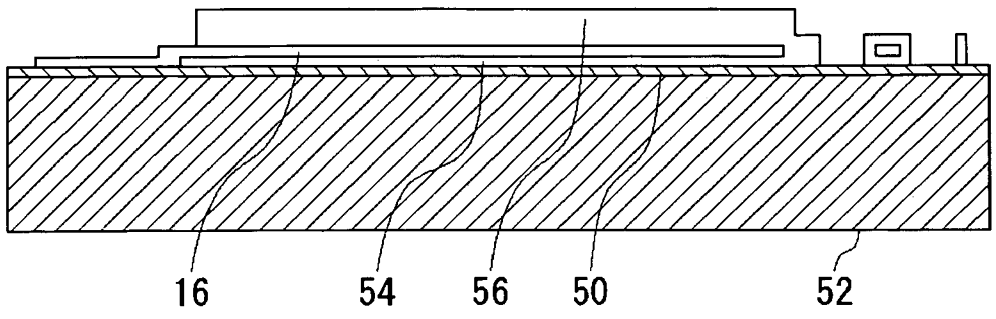
FIGS. 5A-5C illustrate the steps of fabricating the acoustic sensor of FIG. 1 that follow the steps of FIGS. 4A-4C.
Figure 5B:
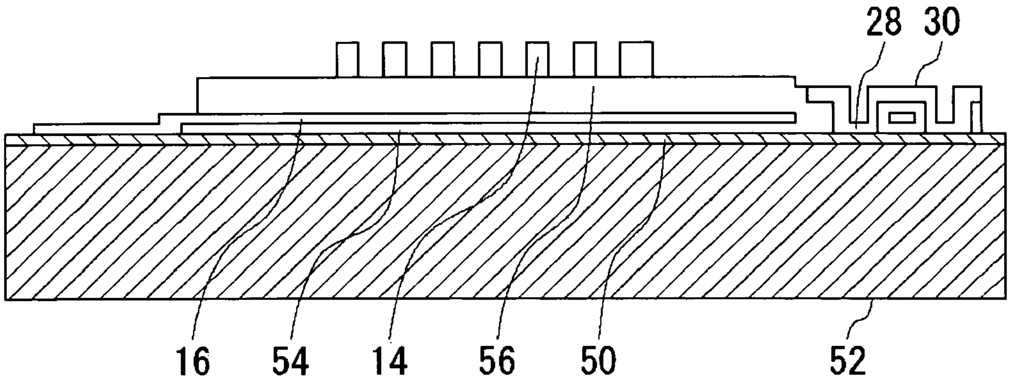
Figure 5C:
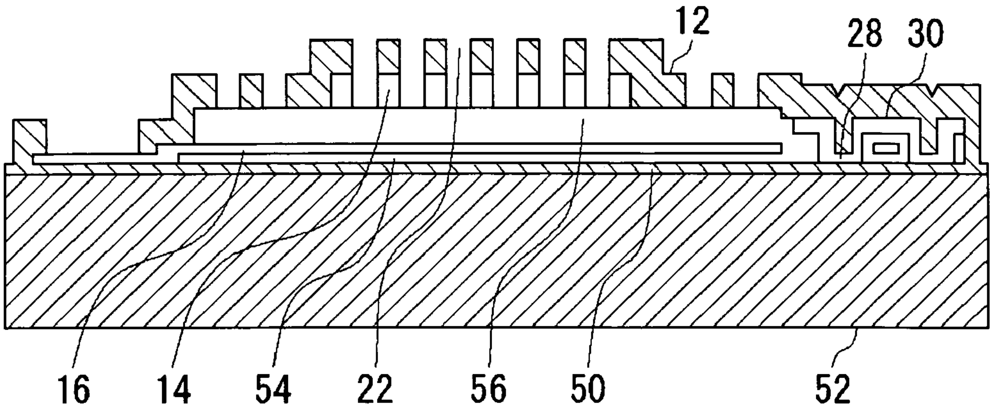

FIGS. 5A-5C illustrate the steps of fabricating the acoustic sensor 100 that follows the steps of FIGS. 4A-4C. In step 4 of FIG. 5A, a second sacrificial film 56 of a thickness of about 2-5 μm is deposited on the diaphragm electrode 16. Preferably, the second sacrificial film 56 is similar to the first sacrificial film 54 of step 2. Since the film thickness of the second sacrificial film 56 represents the ultimate air gap distance between the electrodes, the thickness largely affects the robustness of the structure of the acoustic sensor 100 as well as being reflected in the capacitance ($C=\epsilon*S/t$, $\epsilon$: dielectric constant, S: area of electrode, t: air gap distance), i.e., the sensitivity. This means that if the air gap layer 10 is too narrow, the diaphragm electrode 16 and the backplate electrode 14 are attached to each other, disabling the sensing activity.

For this reason, the thickness of the second sacrificial film 56 is an important parameter. Considering the hinge structure of the acoustic sensor 100, the suitable air gap distance is 2-5 μm. Subsequently, unnecessary portions in the periphery and the hinge anchor 28 are etched to the etch stopper 50, using the ordinary photolithography technology and the etching technology. Further, the bridge 30 (not shown) is etched halfway so as not to reach the diaphragm electrode 16.

In step 5 of FIG. 5B, a conductive film forming the backplate electrode 14 and a conductive film forming the hinge structure are simultaneously deposited on the second sacrificial film 56. From the viewpoint of mechanical strength, the conductive films may preferably be formed of polysilicon. Unnecessary portions are removed using the ordinary photolithography technology and the etching technology. In this example, the conductive film forming the backplate electrode 14 and the conductive film forming the hinge structure are formed simultaneously. Alternatively, different films may be deposited. In this case, more appropriate film type and film thickness may be selected.

In step 6 of FIG. 5C, the protective film 12 of silicon nitride is deposited on the backplate electrode 14. Unnecessary portions of the silicon nitride film are removed using the ordinary photolithography technology and the etching technology. The unnecessary portions include pad portions and the acoustic hole 22 as well as peripheral portions.

Figure 6A:
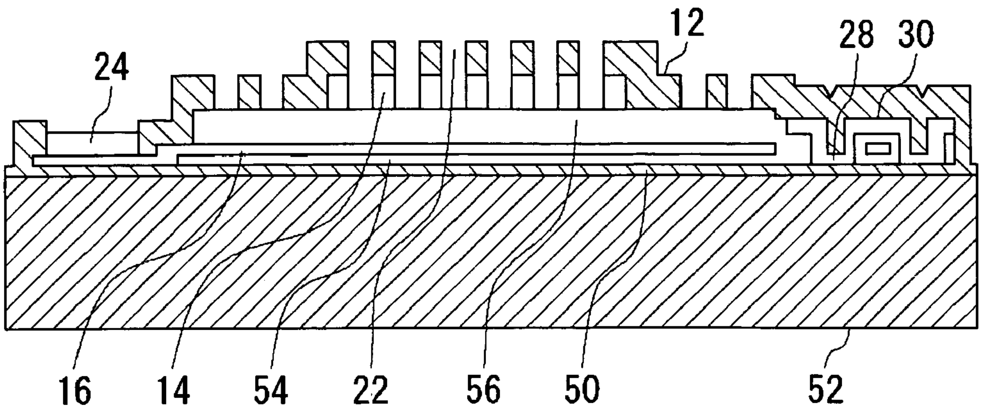
FIGS. 6A-6C illustrate the steps of fabricating the acoustic sensor of FIG. 1 that follow the steps of FIGS. 5A-5C.
Figure 6B:
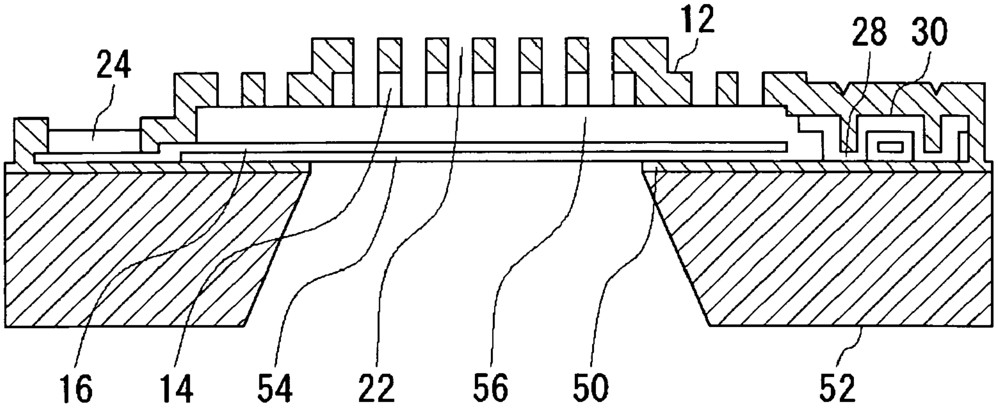
Figure 6C:
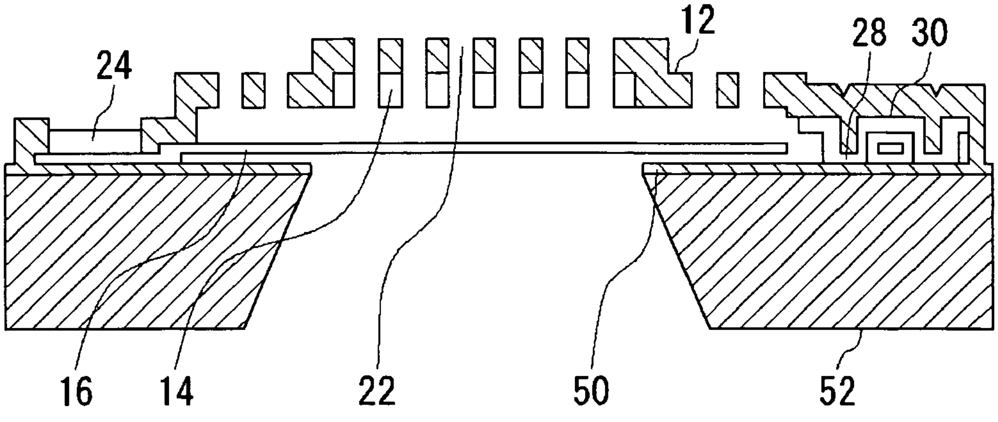

FIGS. 6A-6C illustrate the steps of fabricating the acoustic sensor 100 that follow the steps of FIGS. 5A-5C. In step 7 of FIG. 6A, pad electrodes including the pad electrode 24 for the diaphragm and the pad electrode 26 for the backplate are formed at pad portions. A film of a low-resistance metal such as aluminum, copper and gold are particularly suitable for the pad electrode. The ordinary photolithography technology and the etching technology may be used to form the pad electrodes. In alternative approaches, technologies such as the plating resist method or the resist etch-off method may be used.

In step 8 of FIG. 6B, an etching mask is formed on the underside of the silicon substrate 52. Isotropic etching is performed using this etching mask by an alkali etching solution such as a potassium hydroxide water solution (KOH) and a tetramethyl ammonium hydroxide water solution (TMAH). The isotropic etching is automatically stopped by the etch stopper 50 deposited in step 1. Subsequently, the etch stopper 50 in the opening portion is removed from the underside by an etchant (for example, phosphoric acid) or by dry etching.

In step 9 of FIG. 6C, the first sacrificial film 54 and the second sacrificial film 56 are completely removed by selectively etching the first sacrificial film 54 and the second sacrificial film 56 using HF from the acoustic hole 22 and from the underside. As a result of this, the air gap layer 10 and the hinge structure are ultimately formed.

According to the described example of the present invention, the diaphragm electrode is only secured to the silicon substrate via the single fixed end. Therefore, it is ensured that the diaphragm electrode is only slightly affected by a difference in stress between the diaphragm electrode and the silicon substrate. Since the vibration of the diaphragm electrode is restricted by the hinge structure, the structural strength is prevented from being reduced even if the diaphragm electrode is only secured via the single fixed end. The above-described structure also helps decrease the overall capacitance while maintaining the amount of variation in capacitance unchanged. Accordingly, sensitivity is practically increased.

Since the hinge shaft and single fixed end are formed as projections, the area of air gap formed by the diaphragm electrode and the backplate electrode is reduced accordingly even when the hinge shaft and the single fixed end are removed from an area occupied by the backplate electrode. Accordingly, the structural strength is improved. Further, the protrusions help prevent the diaphragm electrode from being attached to the silicon substrate. Since the backplate electrode occupies only a portion of the opening in the base, the sensitivity of the acoustic sensor is improved accordingly. Since the diaphragm electrode is secured to the substrate via the hinge structure, movement parallel with the plane of the diaphragm electrode is restricted. Further, since the diaphragm electrode is secured to the substrate via the hinge structure, shock received in a direction parallel with the plane of the diaphragm electrode is absorbed by the diaphragm electrode being moved to a certain degree.

SECOND EXAMPLE

Like the first example, the second example relates to a capacitive silicon microphone formed on a semiconductor substrate. In the capacitive silicon microphone according to the first example, the diaphragm electrode is secured to the semiconductor substrate via the hinge structure. In the capacitive silicon microphone according to the second example, a hook projection is provided in the diaphragm electrode so that the hook part is engaged with the semiconductor substrate. As a result, the capacitive silicon microphone according to the second example is of a simpler structure than the capacitive silicon microphone according to the first example. As in the first example, the diaphragm electrode according to the second example is only slightly affected by a difference in stress between the diaphragm electrode and the semiconductor substrate. Thus, even if the diaphragm electrode is secured via the single fixed end, the structural strength is prevented from being reduced. Further, the sensitivity and the structural strength are improved.

Figure 7:
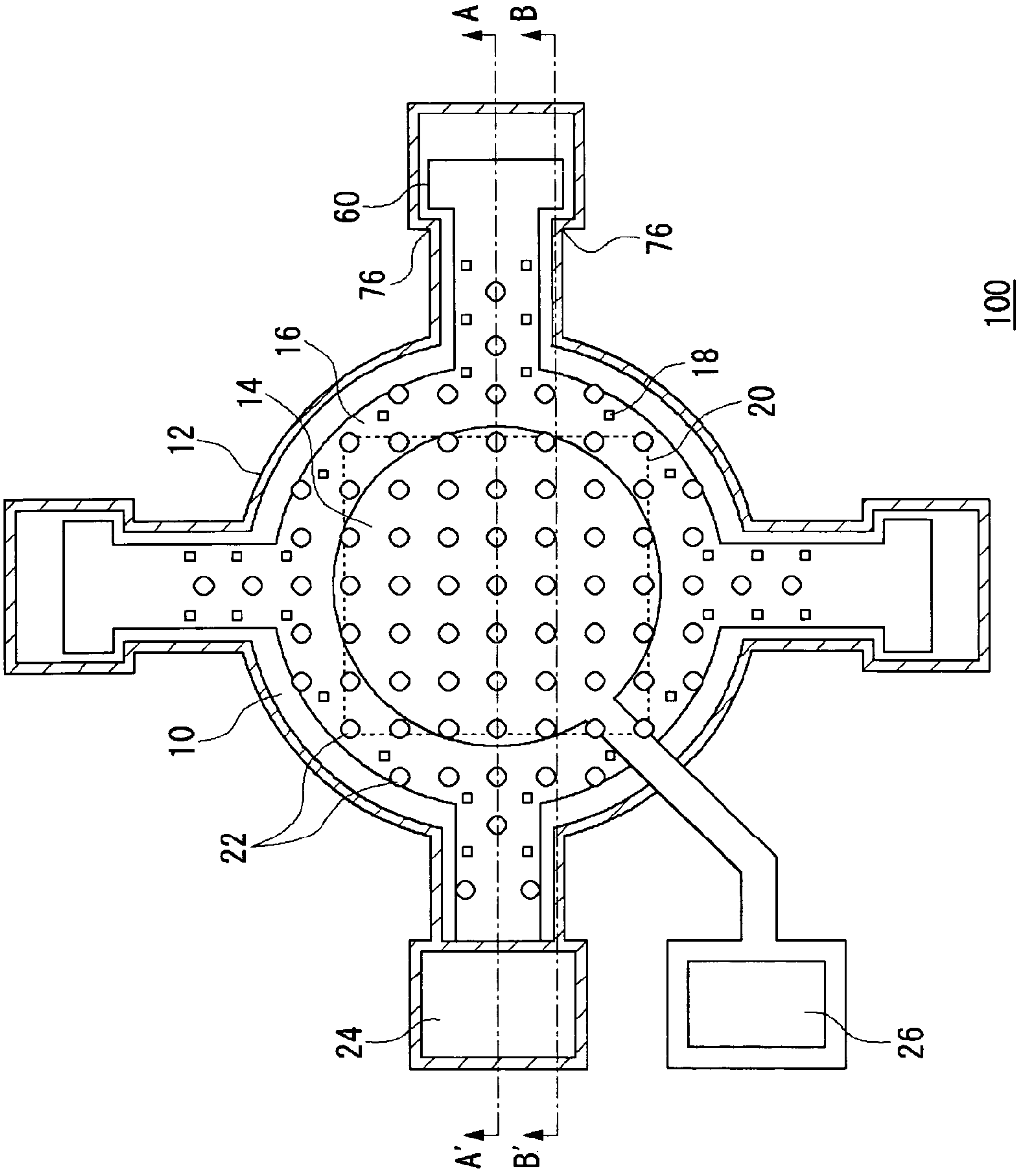
FIG. 7 is a top view illustrating the structure of an acoustic sensor according to a second example of the present invention.
Figure 8:
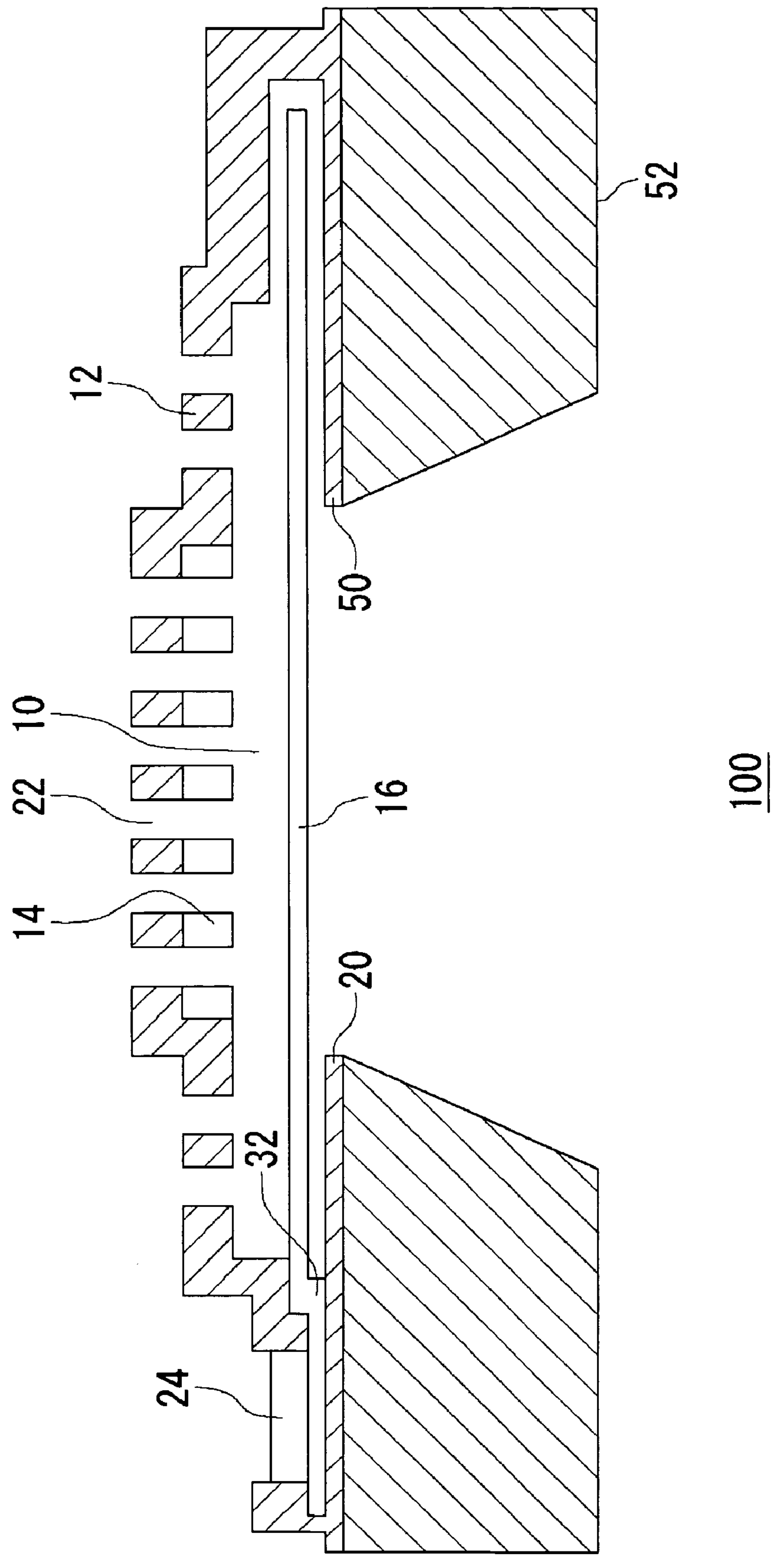
FIG. 8 is a first section of the acoustic sensor of FIG. 7.
Figure 9:
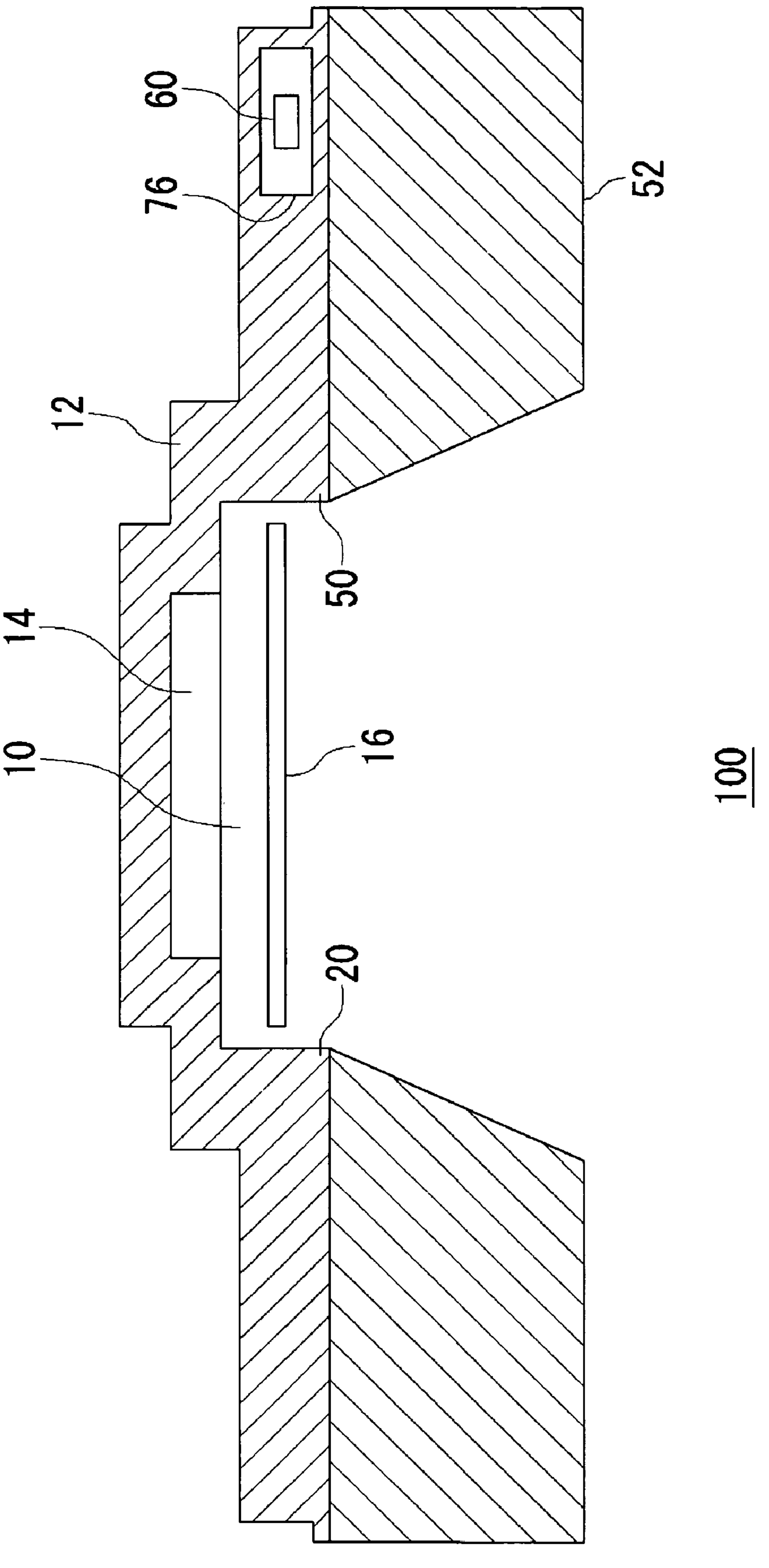
FIG. 9 is a second section of the acoustic sensor of FIG. 7.

FIG. 7 is a top view illustrating the structure of the acoustic sensor 100 according to a second example of the present invention. FIG. 8 is a first section of the acoustic sensor 100. FIG. 9 is a second section of the acoustic sensor 100. FIG. 8 is a A-A' section of the acoustic sensor 100 of FIG. 7; and FIG. 9 is a B-B' section of the acoustic sensor 100 of FIG. 7. Unlike the acoustic sensor 100 of FIG. 1, the acoustic sensor 100 of FIG. 7 includes a hook part 60 and a hook socket 76. The acoustic sensor 100 of FIG. 7 includes parts that are identical to the parts of the acoustic sensor 100 of FIG. 1 so that the following description concerns differences.

Referring to FIG. 7, the diaphragm electrode 16 has four projections extending in respective directions of diameter that are orthogonal to each other. The fixed end 32 is provided in one of the four projections. The hook part 60 is formed in the other three projections. As is obvious from FIG. 9, as a result of the hook part 60 being engaged with the hook socket 76, the diaphragm electrode 16 is secured to the silicon substrate 52. More specifically, as illustrated in the top view of FIG. 7, each of the projections of the diaphragm electrode 16 is wider at the hook part 60. In other words, the hook part 60 is T-shaped. Further, the hook socket 76 is provided above the silicon substrate 52 so as to be narrower than the hook part 60. The part of the protective film 12 beyond the hook socket 76 toward the distal end is formed to match the configuration of the hook part 60. That is, the distal end part of the protective film 12 is also T-shaped.

Referring to FIG. 9, the hook socket 76 in this structure restricts the movement of the hook part 60 in the right-to-left direction, i.e., the direction facing the area in which the diaphragm electrode 16 overlaps the backplate electrode 14. The side of the protective film 12 opposite to the hook socket 76 across the hook part 60 restricts the movement of the hook part 60 in the left-to-right direction or the movement toward the distal end of the projection of the diaphragm electrode 16. Referring to FIG. 9, the part of the protective film 12 provided above the hook part 60 restricts the upward movement of the hook part 60. As a result of the movement of the hook part 60 being restricted as such, the movement of the diaphragm electrode 16 is restricted accordingly. The hook part 60 and the at least one fixed end 32 are provided outside an area above the upper surface of the silicon substrate 52 occupied by the backplate electrode 14.

As illustrated in FIG. 8 and FIG. 9, the protective film 12 is formed to cover the backplate electrode 14 and the diaphragm electrode 16. The protective film 12 is provided with the hook socket 76 for engaging the hook part 60. Alternatively, the hook socket 76 may be provided in the silicon substrate 52. As illustrated in FIG. 3, the diaphragm protrusions 18 may be formed in the diaphragm electrode 16.

Figure 10A:
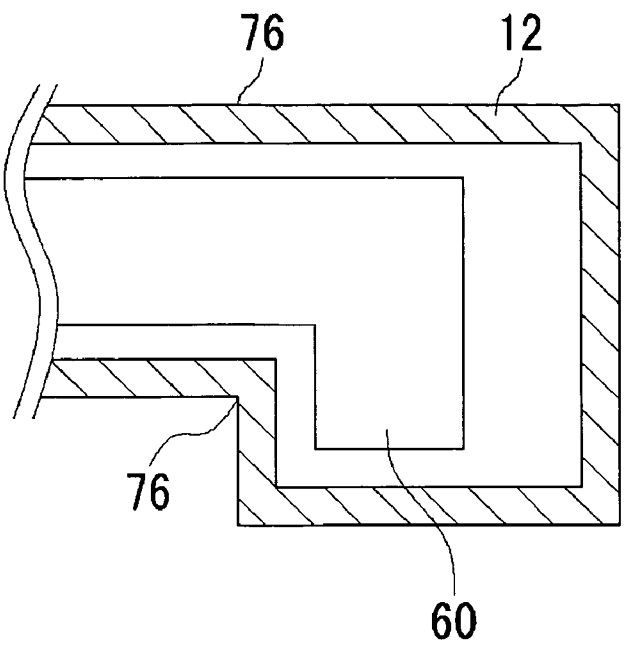
FIGS. 10A-10B are top views of the acoustic sensors of FIG. 7 according to variations.
Figure 10B:
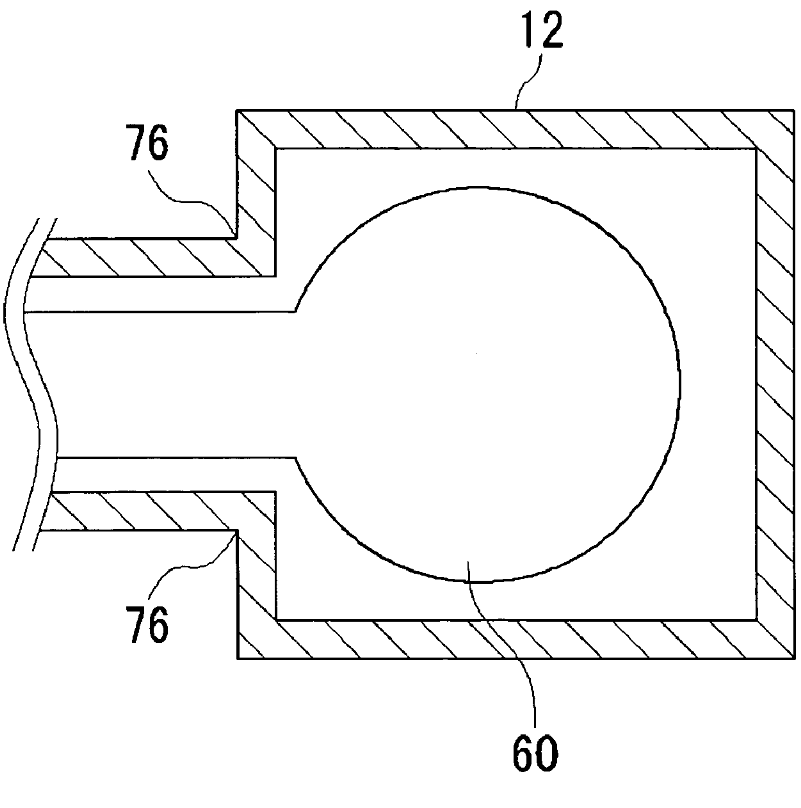

The description referring to FIG. 7 assumes that the hook part 60 is T-shaped. Alternatively, the hook part 60 may be of a configuration other than a T shape. What is essential is that the width of the hook part 60 is larger than the width of the mouth of the hook socket 76. FIGS. 10A-10B are top views of the acoustic sensors 100 according to variations. These drawings illustrate the neighborhood of the distal end of the projection of the diaphragm electrode 16 according to variations of the structure of FIG. 7. FIG. 10 illustrates a case where the hook part 60 in the projection of the diaphragm electrode 16 extends only in one direction widthwise. More specifically, the hook part 60 is inverse L-shaped. In this case, too, the width of the hook part 60 is larger than the width of the mouth of the hook socket 76.

FIG. 10B illustrates a case where the hook part 60 in the projection of the diaphragm electrode 16 extends in a circular configuration. The hook part 60 is not formed to have corners, but portions thereof are formed to be wider than the mouth of the hook socket 76. In the above examples, the hook part 60 is described assuming that it extends parallel with the upper surface of the silicon surface 52. Alternatively, the hook part 60 may extend in a direction perpendicular to the upper surface of the silicon substrate 52. More specifically, the hook part 60 may be formed as illustrated in FIG. 7, FIG. 10A or FIG. 10B in the cross section of the acoustic sensor 100. The hook socket 76 will be formed to match the configuration of the hook part 60. The hook part 60 with these alternative configurations will also be engaged with the hook socket 76.

The structure of the acoustic sensor 100 according to the second example will be summarized as follows. The body of the diaphragm electrode 16 is spaced apart from the silicon substrate 52. The diaphragm electrode 16 is secured to the silicon substrate 52 via the fixed end 32. As a result of the diaphragm electrode 16 being engaged with the silicon substrate 52, the movement of the diaphragm electrode 16 in the rotational direction, height direction and radial direction is restricted. In the radial direction, there is a certain movement allowance. The hook part 60 of the diaphragm electrode 60 may be oriented either vertically or horizontally. The diaphragm electrode 16 is provided with a plurality of hook parts 60.

According to the second example of the present invention, the diaphragm electrode is only secured to the silicon substrate via at least one fixed end. Accordingly, it is ensured that the diaphragm electrode is only slightly affected by a difference in stress between the diaphragm electrode and the silicon substrate. Since the vibration of the diaphragm electrode is restricted by the engagement at the hook part, the structural strength is prevented from being reduced even if the diaphragm electrode is only secured via the at least one fixed end. Since the diaphragm electrode and the semiconductor substrate are only engaged with each other by the hook part except at the fixed end, the structure is simplified. The hook socket provided in the silicon substrate engages therewith with the hook part provided in the diaphragm electrode. The above-described structure also helps decrease the overall capacitance while maintaining the amount of variation in capacitance unchanged. Accordingly, sensitivity is practically increased.

Since the hook part and the single fixed end are formed as projections, the area of air gap formed by the diaphragm electrode and the backplate electrode is reduced accordingly even when the hook part and the single fixed end are removed from an area occupied by the backplate electrode. Accordingly, the structural strength is improved. Since the backplate electrode occupies only a portion of the opening in the base, the sensitivity of the acoustic sensor is improved. Since the diaphragm electrode is engaged with the hook part, movement parallel with the plane of the diaphragm electrode is restricted. Since the diaphragm electrode is engaged with the hook part, shock received in a direction parallel with the plane of the diaphragm electrode is absorbed by the diaphragm electrode being moved to a certain degree.

The movement of the diaphragm electrode in the rotational direction, height direction and radial direction is restricted according to the structure of the example, the mechanical strength of the diaphragm electrode is improved. With the structure of the example, the body of the diaphragm electrode is separated from the silicon substrate so that internal stress and bending moment are reduced accordingly. Since there is a certain movement allowance in the radial direction, internal stress is reduced. Additionally, the structure according to the second example successfully prevents collision of the backplate electrode and the diaphragm electrode that may cause noise, and also prevents displacement that worsens the characteristics such as irreversible displacement of the diaphragm electrode due to severe shock applied, for example, when the microphone is dropped.

THIRD EXAMPLE

Like the first and second example of the present invention, the third example is related to a capacitive silicon microphone formed on a semiconductor substrate. In the capacitive silicon microphone according to the second example, a hook projection is provided in the diaphragm electrode so that the hook part is engaged with the semiconductor substrate. In the capacitive silicon microphone according to the third example, projections are provided in the diaphragm electrode and the distal end of the projection is ring-shaped. By running a shaft provided in the semiconductor substrate through the ring-shaped end, the diaphragm electrode is engaged with the semiconductor substrate. As demonstrated in the third example, the present invention is adaptable to a variety of configurations. The capacitive silicon microphone according to the third example provides the same effects as the capacitive silicon microphones according to the first and second examples.

The acoustic sensor 100 according to the third example has a configuration similar to that of the acoustic sensors of FIG. 7 through FIG. 9. The acoustic sensor according to the third example differs from the acoustic sensors of FIG. 7 through FIG. 9 in the configuration of the vicinity of the end of the projection. Therefore, the following description will focus on the configuration of the vicinity of the end of the projection.

Figure 11A:
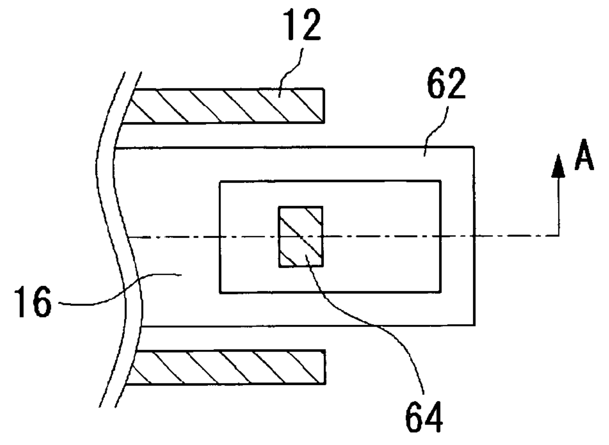
FIG. 11A is a top view of an acoustic sensor according to a third example of the present invention.
Figure 11B:
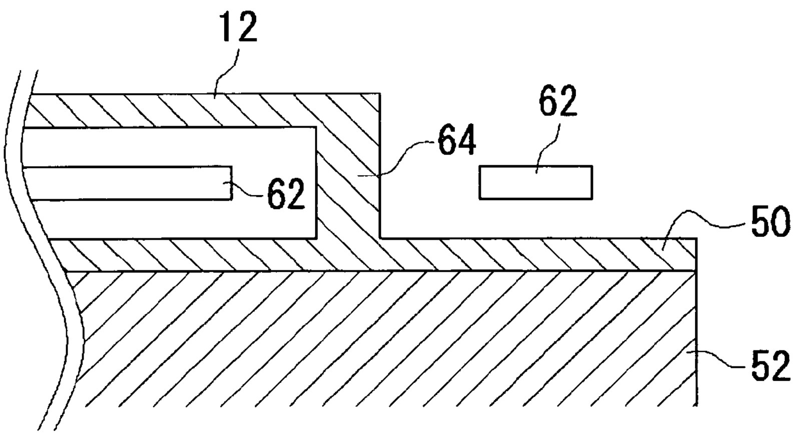
FIG. 11B is a section of the acoustic sensor of FIG. 11A.
Figure 11C:
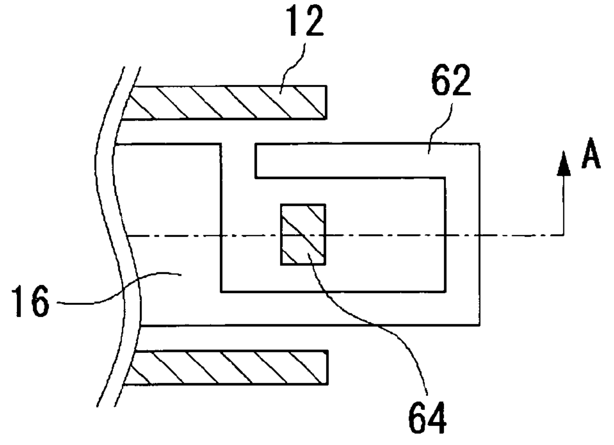
FIG. 11C is a top view of the acoustic sensor of FIG. 11A according to a variation.

FIG. 11A is a top view of an acoustic sensor according to a third example of the present invention; FIG. 11B is a section of the acoustic sensor of FIG. 11A; and FIG. 11C is a top view of the acoustic sensor of FIG. 11A according to a variation. The acoustic sensor 100 includes a ring part 62 and a shaft part 64. FIG. 11A corresponds to a top view and FIG. 11B corresponds to a cross section. The left-to-right direction in FIGS. 11A and 11B is toward the distal end of the projection. The ring part 62 is provided at the distal end of the projection of the diaphragm electrode 16. As illustrated, the center of the ring part 62 is hollow. As illustrated in FIG. 11B, the center of the ring part 62 is run through by the shaft part 64 provided in the protective film 12. The shaft part 64 may be provided in the silicon substrate 52. With this structure, the diaphragm electrode 16 is engaged with the silicon substrate 52. More specifically, as illustrated in a top view of FIG. 11A, the ring part 62 in the projection of the diaphragm electrode 16 has a hole in the central part. Since the shaft part 64 is provided in the hole part, the shaft part 64 restricts the movement of the ring part 62 in a direction parallel with the upper surface of the silicon substrate 52. The diaphragm electrode 16 may be provided with diaphragm protrusions 18 as illustrated in FIG. 3.

Referring to FIG. 11B, the shaft part 64 restricts the movement of the ring part 62 in the left-to-right and right-to-left directions, i.e., in the direction toward an area in which the diaphragm electrode 16 overlaps the backplate electrode 14 and in the direction toward the distal end of the projection of the diaphragm electrode 16. Referring also to FIG. 11B, the part of the protective film 12 provided above the ring part 62 restricts the upward movement of the ring part 62. As a result of the movement of the ring part 62 being restricted as such, the movement of the diaphragm electrode 16 is also restricted accordingly.

The shaft part 64 and the at least one fixed end 32 are provided outside an area above the upper surface of the silicon surface 52 occupied by the backplate electrode 14. FIG. 11C illustrates a structure according to a variation of the structure of FIG. 11A. The ring part 62 is not completely ring-shaped. More specifically, the ring part 62 may be broken at a portion thereof. The shaft part 64 will also restrict the movement of the ring part 62 with this structure. As a result, the same effects as those of FIGS. 11A and 11B are provided. The shaft part 64 may have a configuration as that of the hook part 60. The ring part 62 will be formed to match the configuration.

Figure 12A:
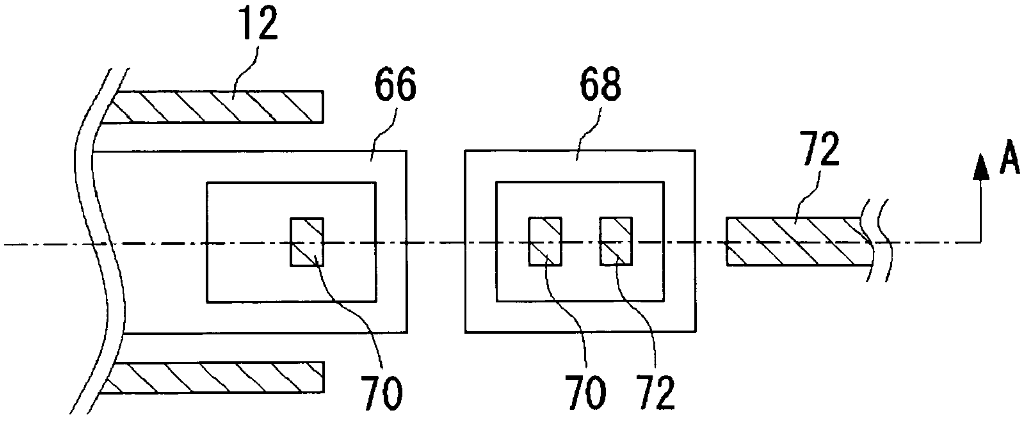
FIG. 12A is a top view of the acoustic sensor of FIGS. 11A-11C according to a variation.
Figure 12B:
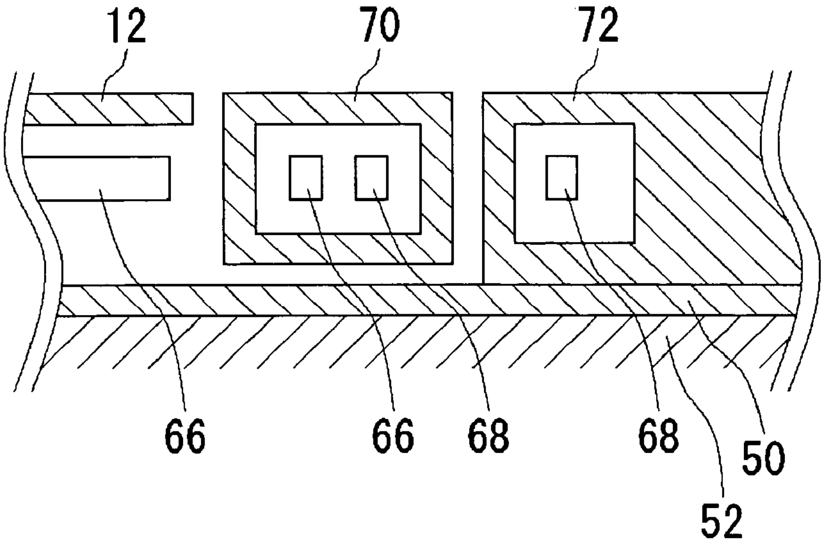
FIG. 12B is a section of the acoustic sensor of FIG. 12A.

FIG. 12A is a top view of the acoustic sensor of FIGS. 11A-11C according to a variation; and FIG. 12B is a section of the acoustic sensor of FIG. 12A. The acoustic sensor 100 includes a first ring part 66, a second ring part 68, a third ring part 70 and a fourth ring part 72. The right side in FIGS. 12A and 12B corresponds to the distal end of the projection of the diaphragm electrode 16. The first ring part 66 corresponds to the ring part 62 of FIG. 11A. The ring part 66 is engaged with the third ring part 70. The third ring part 70 is engaged with the second ring part 68. The second ring part 68 is engaged with the fourth ring part 72. As illustrated in FIG. 12B, the third ring part 70 and the fourth ring part 72 have configurations obtained by rotating the opened part of the first ring part 66 by 90°. The third ring part 70 and the fourth ring part 72 are provided above the silicon substrate 52. The first ring part 66 through the fourth ring part 72 are chained to each other in succession toward the distal end of the projection of the diaphragm electrode 16.

Figure 13A:
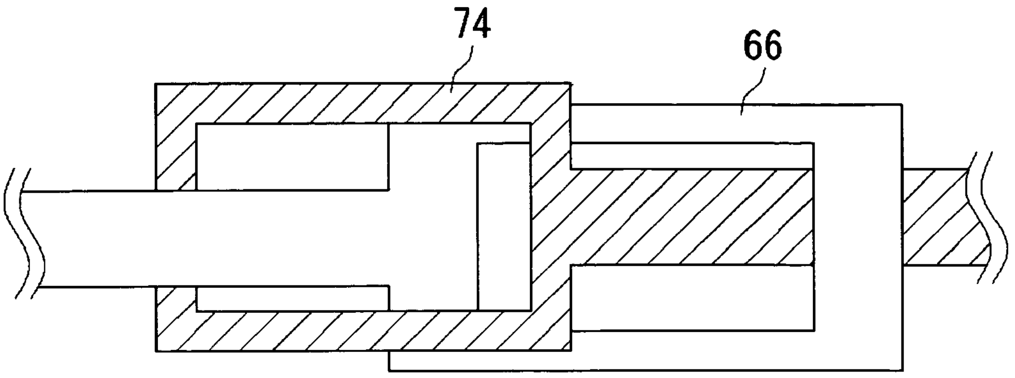
FIGS. 13A-13B are top views of the acoustic sensors of FIGS. 11A-11B according to other variations.
Figure 13B:
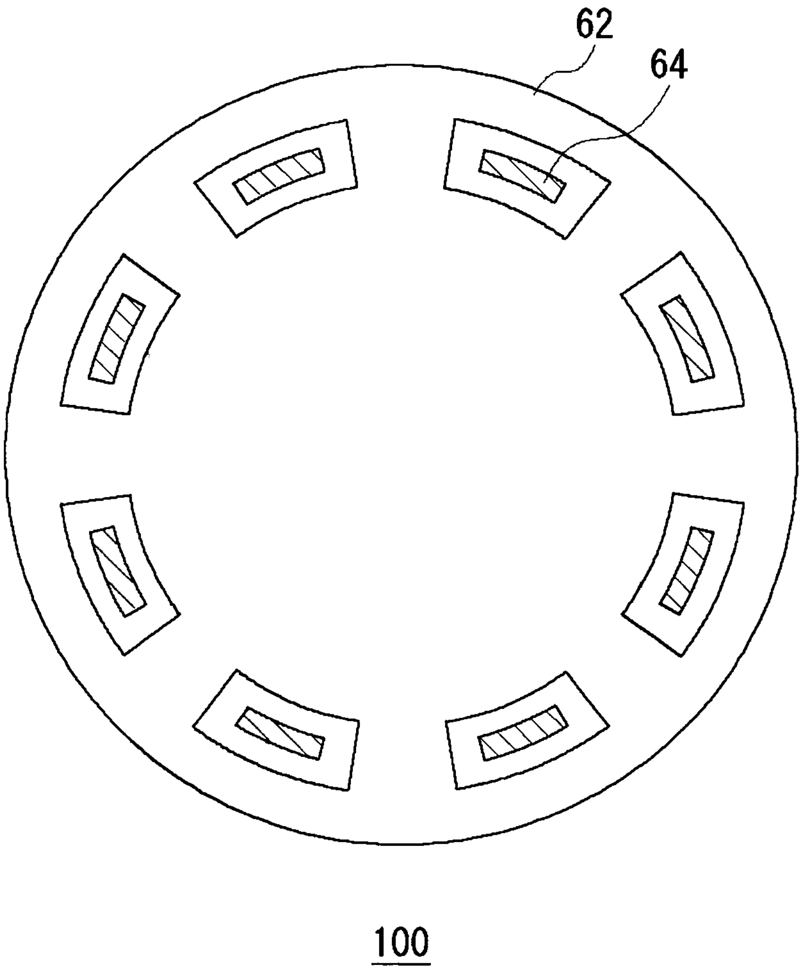

FIGS. 13A-13B are top views of the acoustic sensors of FIGS. 11A-11B according to other variations. The structure of FIG. 13A includes the first ring part 66 and a fifth ring part 74. The right side in FIG. 13A corresponds to the distal end of the projection of the diaphragm electrode 16. The fifth ring part 74 is provided above the silicon substrate 52 (not shown). As illustrated in FIG. 13A, the first ring part 66 is engaged with the fifth ring part 74 with the result that the diaphragm electrode 16 is engaged with the silicon substrate 52.

Like FIG. 1, FIG. 13 is a top view illustrating the entirety of the acoustic sensor 100. In order to highlight the structure involving the ring part 62 and the shaft par 64 in this illustration, parts other than these illustrated in FIG. 1 are omitted. For example, the backplate electrode 14, the pad electrode 24 for the diaphragm and the pad electrode 26 for the backplate are omitted from the illustration. A plurality of ring parts 62 are provided along the circumference of the acoustic sensor 100. The shaft part 64 is provided in a hole at the center of each of the ring parts 62. The relation between a single ring part 62 and a single shaft part 64 corresponds to the relation between the ring part 62 and the shaft part 64 illustrated in FIGS. 11A and 11B.

According to the third example of the present invention, the diaphragm electrode is only secured to the silicon substrate via at least one fixed end. Therefore, it is ensured that the diaphragm electrode is only slightly affected by a difference in stress between the diaphragm electrode and the silicon substrate. Since the vibration of the diaphragm electrode is restricted by the engagement at the ring part, the structural strength is prevented from being reduced even if the diaphragm electrode is only secured via the single fixed end. The shaft part provided in the silicon substrate engages therewith the ring part provided in the diaphragm electrode. The above-described structure also helps decrease the overall capacitance while maintaining the amount of variation in capacitance unchanged. Accordingly, sensitivity is practically increased.

Since the ring part and the single fixed end are formed as projections, the area of air gap formed by the diaphragm electrode and the backplate electrode is reduced accordingly even when the ring part and the single fixed end are removed from an area occupied by the backplate electrode. Accordingly, the structural strength is improved. Since the backplate electrode occupies only a portion of the opening in the base, the sensitivity of the acoustic sensor is improved. Since the diaphragm electrode is engaged with the ring part, movement parallel with the plane of the diaphragm electrode is restricted. Since the diaphragm electrode is engaged with the ring part, shock received in a direction parallel with the plane of the diaphragm electrode is absorbed by the diaphragm electrode being moved to a certain degree.

Described above is an explanation based on the examples. The examples of the present invention are only illustrative in nature and it will be obvious to those skilled in the art that various variations in constituting elements and processes are possible within the scope of the present invention.

In the first through third examples of the present invention, it is assumed that there is only one fixed end 32. Alternatively, a plurality of fixed ends may be provided. Alternatively, the area of the fixed end 32 may be enlarged. According to this variation, the intensity of the acoustic sensor 100 is improved. What is essential is that the diaphragm electrode 16 is secured to the silicon substrate 52.

In the first example of the present invention, the diaphragm electrode 16 is fitted to the silicon substrate 52 via the three hinge structures and the one fixed end 32. Alternatively, more or fewer than three hinge structures may be provided. According to the examples of the present invention, the diaphragm electrode 16 can be formed in a variety of configurations. What is essential is that the diaphragm electrode 16 is engaged with the silicon substrate 52.

In the first through third examples, the acoustic sensor 100 is comprised of the silicon substrate 52, the diaphragm electrode 16 and the backplate electrode 14 arranged in the stated order. Alternatively, the arrangement may be in the order of the silicon substrate 52, the backplate electrode 14 and the diaphragm electrode 16. In this case, sound pressure input via the substrate opening 20, or the sound hole provided in the silicon substrate 52, passes through the acoustic hole 22 provided in the backplate electrode 14 and vibrates the diaphragm electrode 16. According to this variation, the present invention can be applied to a variety of structures of the acoustic sensor 100. What is essential is that the diaphragm electrode 16 is vibrated by sound pressure.

The first through third examples may be combined in an arbitrary manner. According to the combinations, the combined effects from the first through third examples are provided.

Although the present invention has been described by way of exemplary embodiments and modifications, it should be understood that many other changes and substitutions may further be made by those skilled in the art without departing from the scope of the present invention which is defined by the appended claims.

What is claimed is:

1. An acoustic sensor comprising:

a movable electrode which is secured to a first surface of a semiconductor substrate via at least one fixed end so as to cover a sound hole provided in the semiconductor substrate;

a fixed electrode provided to form a capacitor in combination with the movable electrode; and an output unit which, when the movable electrode is vibrated due to sound pressure entering from a second surface of the semiconductor substrate via the sound hole, outputs variation in the capacitance of the capacitor due to the vibration as an audio signal, wherein a hinge shaft is formed in a part of the movable electrode other than the at least one fixed end, and the movable electrode is engaged with the semiconductor substrate by a hinge structure based on the hinge shaft.

2. The acoustic sensor according to claim 1, wherein the hinge shaft and the at least one fixed end of the movable electrode are provided outside an area above the first surface of the semiconductor substrate occupied by the fixed electrode.

3. The acoustic sensor according to claim 2, wherein the movable electrode are formed as projections outside an area occupied by the fixed electrode.

4. An acoustic sensor comprising:

a movable electrode which is secured to a first surface of a semiconductor substrate via at least one fixed end so as to cover a sound hole provided in the semiconductor substrate;

a fixed electrode provided to form a capacitor in combination with the movable electrode; and an output unit which, when the movable electrode is vibrated due to sound pressure entering from a second surface of the semiconductor substrate via the sound hole, outputs variation in the capacitance of the capacitor due to the vibration as an audio signal, wherein a hook part is provided in a part of the movable electrode other than the at least one fixed end, and the movable electrode is engaged with the semiconductor substrate via the hook part.

5. The acoustic sensor according to claim 4, wherein the hook part of the movable electrode is engaged with a socket for the hook part provided in the semiconductor substrate.

6. The acoustic sensor according to claim 4, wherein the hook part and the at least one fixed end of the movable electrode are provided outside an area above the first surface of the semiconductor substrate occupied by the fixed electrode.

7. The acoustic sensor according to claim 5, wherein the hook part and the at least one fixed end of the movable electrode are provided outside an area above the first surface of the semiconductor substrate occupied by the fixed electrode.

8. An acoustic sensor comprising:

a movable electrode which is secured to a first surface of a semiconductor substrate via at least one fixed end so as to cover a sound hole provided in the semiconductor substrate;

a fixed electrode provided to form a capacitor in combination with the movable electrode; and an output unit which, when the movable electrode is vibrated due to sound pressure entering from a second surface of the semiconductor substrate via the sound hole, outputs variation in the capacitance of the capacitor due to the vibration as an audio signal, wherein a projection with a ring-shaped end is provided in a part of the movable electrode other than the at least one fixed end, and the movable electrode is engaged with the semiconductor substrate via the projection with a ring-shaped end.

9. The acoustic sensor according to claim 8, wherein the movable electrode is engaged with the semiconductor substrate by the ring-shaped end of the projection of the movable electrode being run through by a shaft provided in the semiconductor substrate.

10. The acoustic sensor according to claim 8, wherein the projection of the movable electrode and the at least one fixed end are provided outside an area above the first surface of the semiconductor substrate occupied by the fixed electrode.

11. The acoustic sensor according to claim 9, wherein the projection of the movable electrode and the at least one fixed end are provided outside an area above the first surface of the semiconductor substrate occupied by the fixed electrode.

12. An acoustic sensor comprising:

a movable electrode which is secured to a first surface of a semiconductor substrate via at least one fixed end so as to cover a sound hole provided in the semiconductor substrate;

a fixed electrode provided to form a capacitor in combination with the movable electrode; and an output unit which, when the movable electrode is vibrated due to sound pressure entering from a second surface of the semiconductor substrate via the sound hole, outputs variation in the capacitance of the capacitor due to the vibration as an audio signal, wherein the movable electrode is engaged with the semiconductor substrate via a part other than the at least one fixed end using a securing method different from the method of securing the movable electrode to the at least one end.

13. The acoustic sensor according to claim 1, wherein the movable electrode is provided with a protrusion at a portion facing the first surface of the semiconductor substrate.

14. The acoustic sensor according to claim 4, wherein the movable electrode is provided with a protrusion at a portion facing the first surface of the semiconductor substrate.

15. The acoustic sensor according to claim 8, wherein the movable electrode is provided with a protrusion at a portion facing the first surface of the semiconductor substrate.

16. The acoustic sensor according to claim 12, wherein the movable electrode is provided with a protrusion at a portion facing the first surface of the semiconductor substrate.

* * * * *